United States Patent
Yaegashi

(10) Patent No.: US 8,067,889 B2
(45) Date of Patent: Nov. 29, 2011

(54) STACKED DISPLAY MEDIUM

(75) Inventor: Hiroyuki Yaegashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1069 days.

(21) Appl. No.: 11/892,389

(22) Filed: Aug. 22, 2007

(65) Prior Publication Data
US 2008/0062074 A1 Mar. 13, 2008

(30) Foreign Application Priority Data
Sep. 12, 2006 (JP) ................... 2006-246869

(51) Int. Cl.
*H01L 51/50* (2006.01)

(52) U.S. Cl. ....................................... 313/505
(58) Field of Classification Search ........... 313/504–505
See application file for complete search history.

(56) References Cited

U.S. PATENT DOCUMENTS

| 5,703,436 A * | 12/1997 | Forrest et al. ................. 313/506 |
| 6,365,270 B2 * | 4/2002 | Forrest et al. ................. 428/336 |
| 2004/0061439 A1 * | 4/2004 | Cok ............................. 313/512 |

FOREIGN PATENT DOCUMENTS

| JP | 2001-42353 A | 2/2001 |
| JP | 2002-297050 A | 10/2002 |
| JP | 2003-36973 A | 2/2003 |

* cited by examiner

*Primary Examiner* — Toan Ton
*Assistant Examiner* — Hana Featherly
(74) *Attorney, Agent, or Firm* — Birch, Stewart, Kolasch & Birch, LLP.

(57) ABSTRACT

A display medium including a layered structure that comprises two or more stacked display elements that each are provided, on or above a flexible substrate, with a pixel portion and lead line(s) for electrically connecting the pixel portion to outside of the pixel portion, and a hole portion or a cut-away portion included in the display element(s) that are above one or more of the lead line(s) of the display element(s) at a lower portion of the layered structure, so that the one or more of the lead line(s) of the lower portion display element(s) are exposed.

10 Claims, 16 Drawing Sheets

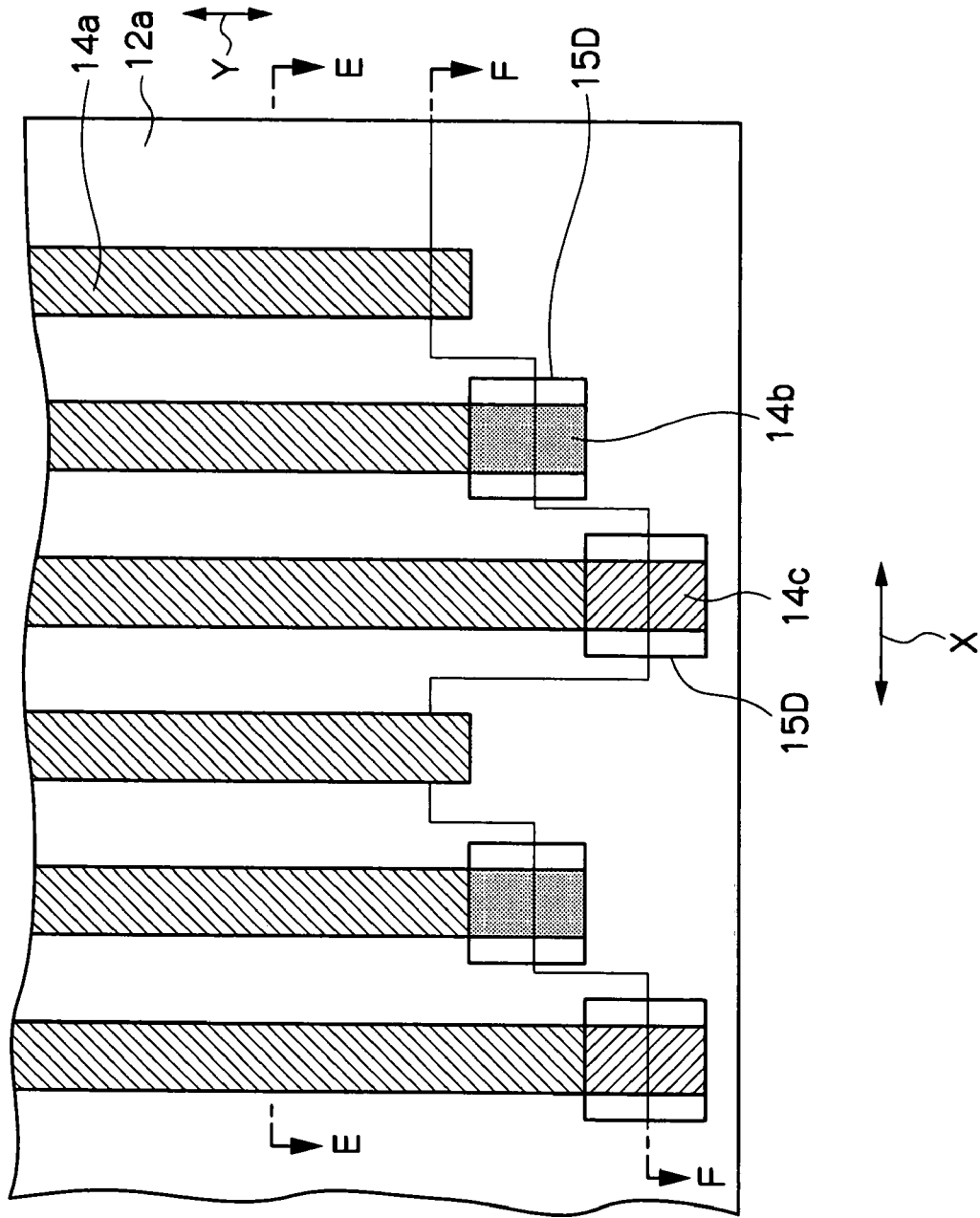

STACKED DISPLAY MEDIUM

CROSS-REFERENCE TO RELATED APPLICATION

This application claims priority under 35 U.S.C. 119 from Japanese Patent Application No. 2006-246869, the disclosure of which is incorporated by reference herein.

BACKGROUND OF THE INVENTION

1. Field of the Invention

The present invention relates to a display medium, and more particularly to a display medium including two or more display elements that have been stacked together.

2. Description of the Related Art

Display mediums from two or more display elements that have been stacked together have been proposed. At the external terminal connection portions of such layered form display mediums, in order for the lead lines from the pixel portion (functional area) of the display elements to be each individually connected to the outside of the pixel portion, patterns are adopted in which, for example, the end portions of the stacked display elements project out from each of the substrates, the end portions of the stacked display elements are disposed in a step shape, or the like (see, for example, Japanese Patent Application (JP-A) Nos. 2001-42353, 2002-297050).

FIG. 16 is an example of a configuration of external terminal connection portions in a conventional layered form display medium and is a partial cross-section showing schematically a display medium of three stacked display elements (100a, 100b and 100c). In FIG. 16, lead lines 102a, 102b and 102c are, respectively, formed to lead from display regions (not shown) in substrates 101a, 101b and 101c in the display elements 100a, 100b and 100c, and external connection relay substrates 103a, 103b and 103c, for electrically connecting pixel portions to the outside, are connected to the respective lead lines 102a, 102b and 102c. 104a, 104b and 104c indicate protection films or cover glass. The 104a is disposed above the display element 100a and protects the surface of the display element 100a. The 104b and 104c are disposed above the display elements 100b and 100c, and protect the surfaces of each of the display elements and are also able to act as insulators.

However, in a conventional layered form display medium like the one described above, there is the problem that the strength of the external terminal connection portions thereof is low. That is to say, in a conventional layered form display medium, since there are end portions of plural display elements stacked in a step shape, or since there are stacked end portions protruding out from each of the substrates, the strength is low at the boundary portion at the end portion of the joining portion(s) where an upper portion display element meets a lower portion display element, and there is the problem that when bending stress is applied to the joining end portion, the lead wiring lines that are present at the boundary portion may break.

Furthermore, electrical connection, between such a display medium and a relay substrate for external connection, must be undertaken for each of the display elements configuring the display medium, and the same number of relay substrates for external connection is required as the number of stacked display elements, and the problem arises that the production process thereof becomes complicated.

Recently, demand for display media that are flexible has risen, because of the ease of transporting and the portability of devices containing such display media. Such flexible display media usually use a flexible substrate of the order of several tens of µm to several hundreds of µm in thickness as the substrate. There is particular demand with flexible display media using flexible substrates for an increase in the strength of the external terminal connection portions thereof, but the present situation is that there is nothing yet available that meets such demands.

SUMMARY OF THE INVENTION

The present invention has been made in consideration of the above-described circumstances and provides a display medium with two or more stacked display elements.

An aspect of the invention is to provide a display medium including a layered structure that comprises two or more stacked display elements that each are provided, on or above a flexible substrate, with a pixel portion and lead line(s) for electrically connecting the pixel portion to outside of the pixel portion, and a hole portion or a cut-away portion included in the display element(s) that are above one or more of the lead line(s) of the display element(s) at a lower portion of the layered structure, so that the one or more of the lead line(s) of the lower portion display element(s) are exposed.

BRIEF DESCRIPTION OF THE DRAWINGS

FIG. 9 is a plan view showing a partial enlargement of an end portion (external terminal connection portion) of a display medium according to a third example modification;

BRIEF DESCRIPTION OF THE INVENTION

Figure 1:
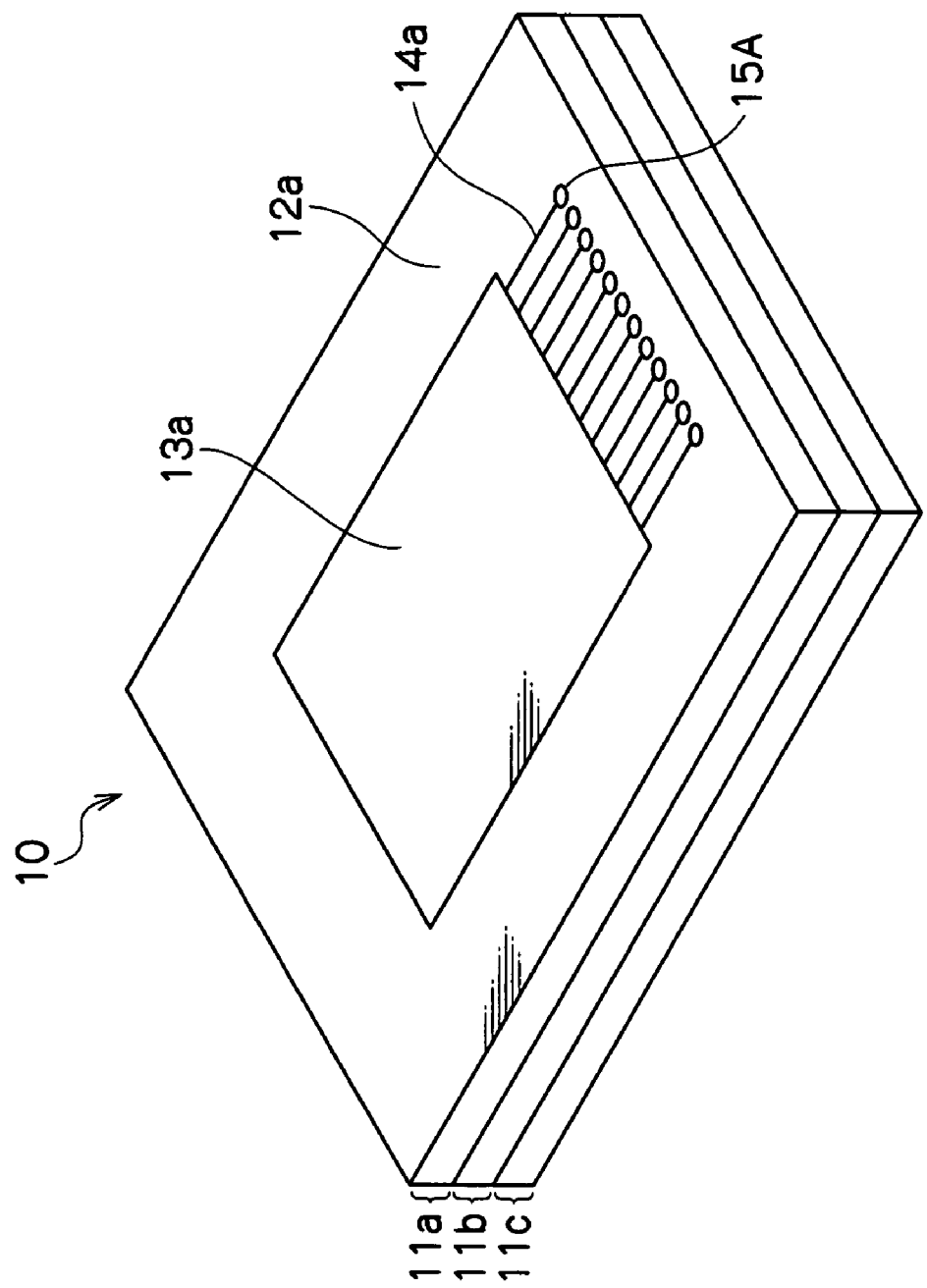
FIG. 1 is a perspective view showing an outline configuration of a display medium according to an exemplary embodiment A of the present invention.

The present invention will be described in detail below.

The display medium of the present invention is a display medium including a layered structure that includes two or more stacked display elements that each are provided, on or above a flexible substrate, with a pixel portion and lead line(s) for electrically connecting the pixel portion to the outside of the pixel portion, and a hole portion or a cut-away portion included in the display element(s) above one or more of the lead lines of the display element(s) at a lower portion of the layered structure so that the one or more of the lead lines of the lower portion display element(s) are exposed.

In the display medium of the present invention, by including the hole portion or the cut-away portion, the external terminal connection portion is strong, and also, easy electrical connection may be made to a relay substrate for external connection, even if there are two or more of the display elements that have been stacked. Specifically, in the display medium of the present invention, by having the hole portion or the cut-away portion such that the lead line(s) of a display element that is at a lower portion of the layered structure are exposed, since the thickness at the end portion may be maintained, even if a bending stress is applied the force thereof is distributed over the whole of the display medium, and so there is no concentration of the stress at a portion of the end portion of the stacked display element, therefore enabling a display medium that has high strength to bending stress. Furthermore, in the display medium of the present invention, the electrical connection from the two or more display elements to external portion(s) does not use two or more relay substrates for external connection, and may be undertaken with a single relay substrate for external connection, therefore electrical connection from the external terminal connection portions to external portion(s) becomes easy, and simplification may be achieved in the manufacturing processes of the display medium. Furthermore, in the present invention, since a flexible substrate is used, the hole portion or the cut-away portion may be easily formed.

The hole portion and the cut-away portion of the present invention are preferably formed by forming the hole portion or the cut-away portion in the display element(s) before stacking the display elements, followed by stacking the display elements. Description will be given later regarding production methods of the display medium of the present invention.

It is preferable that, in the display medium of the present invention, there are two or more of the hole portions or of the cut-away portions, and the two or more of the hole portions or of the cut-away portions are arranged in a row along a direction X, wherein the direction X is a direction that is along one of the edges of the display medium. When two or more of the hole portions or of the cut-away portions are arranged along the direction X, between the two of more of the hole portions or the cut-away portions and at the edge side of the display medium, ridged portions are formed that is of the same thickness as that of the display medium, therefore, the strength at the external terminal connection portion to bending stress or the like may be increased even further.

It is also preferable that, in the display medium of the present invention, there are two or more of the hole portions or of the cut-away portions, and the two or more of the hole portions or of the cut-away portions are arranged along a direction X and stepped in a direction Y, wherein the direction X is a direction that is along one of the edges of the display medium, and the direction Y is a direction that is along an edge of the display medium that is orthogonal to the direction X. By thus arranging the two or more of the hole portions or of the cut-away portions, portions are formed at peripheral portions to the two or more of the hole portions or the cut-away portions that are of the same thickness as the middle portion of the display medium, thereby the strength of the external terminal connection portion of the display medium may be increased even further.

It is preferable, in the display medium of the present invention, to arrange the respective lead lines of each of the two or more stacked display elements so that they are superimposed in the display element stacking direction.

Or, it is preferable in the display medium of the present invention, to arrange the respective lead lines of each of the two or more stacked display elements so that they are parallel to each other in a direction that is orthogonal to the display element stacking direction.

It is preferable, in the display medium of the present invention, to have two or more of the lead lines exposed through a single hole portion or cut-away portion. By having the hole portion or the cut-away portion provided to the display element(s), such that the lead line(s) of the display element(s) that are at a lower portion of the layered structure are exposed, the degrees of freedom in wiring layout of the lead lines may be increased.

It is preferable, in the display medium of the present invention, to further include a protective layer provided on or above a display element located at an upper portion of the layered structure, the protective layer including a hole portion or a cut-away portion provided such that one or more of the lead lines are exposed. By providing the protective layer on or above the display element located at an upper portion of the layered structure, the occurrence of externally caused scratches or the like may be avoided.

In the display medium of the present invention, two or more display elements that are different color s from each other may be included. When, in the present invention, two or more display elements that are different color s from each other are stacked, the aperture area of each of the pixels in a single one of the display elements may be made large, and so the light emitting efficiency of each of the display elements may be increased.

It is preferable in the display medium of the present invention that the pixel portion is a pixel portion that uses organic electroluminescence.

It is preferable in the display medium of the present invention that the two or more display elements are stacked with a adhesive layer therebetween that is formed to cover the whole of the surface between the display elements. By having a adhesive layer, color misalignment arising due to the bending of the display elements may be prevented.

Detailed explanation will now be given of exemplary embodiments of the display medium of the present invention, with reference to FIGS. 1 to 13 that show a first example modification to a fourth example modification of an exemplary embodiment A. However the present invention is not limited to the following exemplary embodiment or example modifications thereof.

FIG. 1 is a perspective view showing an outline configuration of a display medium 10 that is the exemplary embodiment A of the display medium of the present invention. In FIGS. 1, 11a, 11b and 11c are display elements, and display medium 10 has a layered structure of a triple layer of the display elements 11a, 11b, and 11c, and at an end portion thereof (an external terminal connection portion) there are plural hole portions 15A provided that are a feature of the present invention.

In the present exemplary embodiment the hole portions 15A are provided at a single end portion of the display medium 10, however, depending on the wiring layout pattern of the lead lines, the hole portions 15A may also be provided at another end portion.

The display element 11a is provided, on a flexible substrate 12a, with a pixel portion 13a, and lead lines 14a for electrically connecting the pixel portion 13a to outside of the pixel portion. Details of the display element 11b and the display element 11c are not show in FIG. 1, however, similar to display element 11a, they are each configured with, on a flexible substrate, respective pixel portions 13b and 13c, and lead lines 14b and 14c for electrically connecting the pixel portions to outside of the pixel portions.

Figure 2:
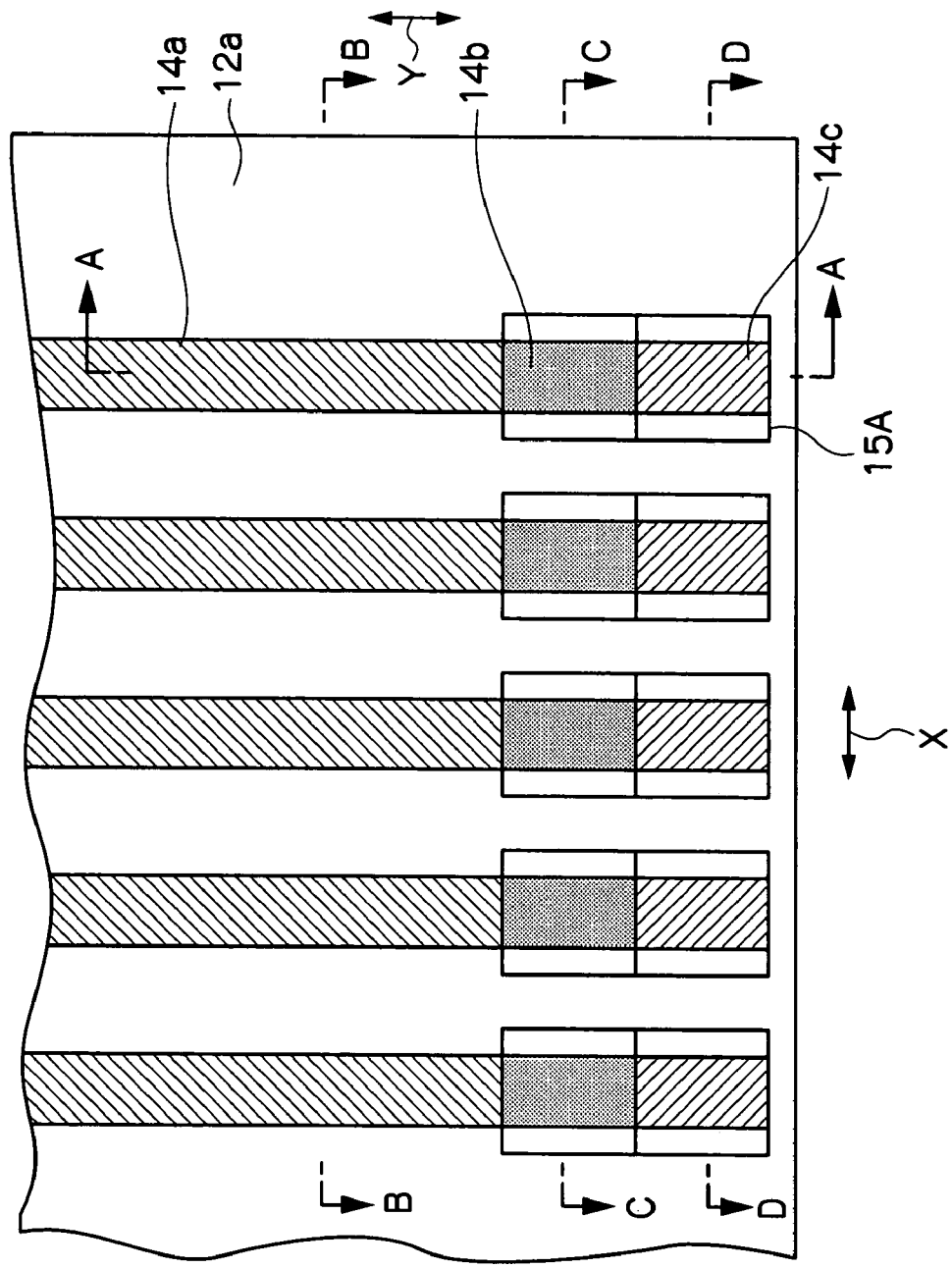
FIG. 2 is a plan view showing a partial enlargement of an end portion of the display medium according to the exemplary embodiment A of the present invention.
Figure 3:
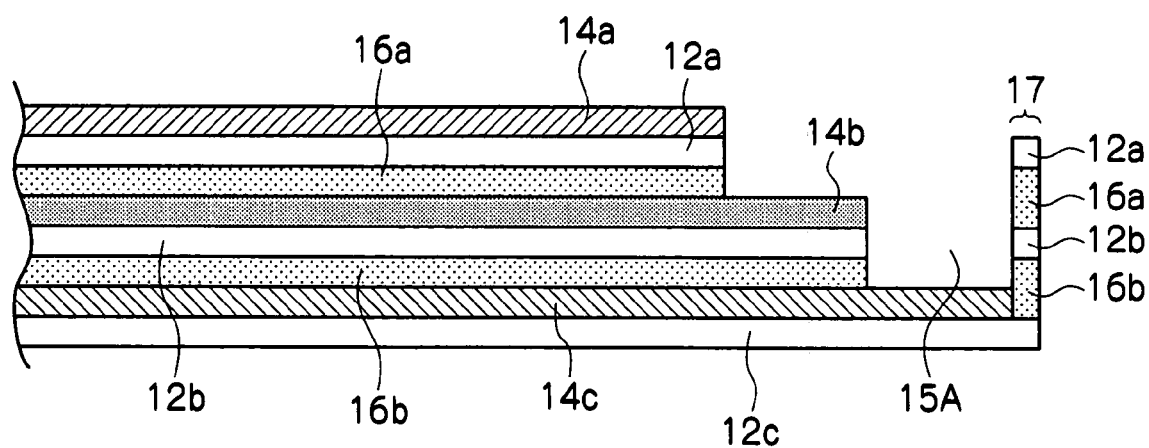
FIG. 3 is an end cross-section taken along A-A of FIG. 2.
Figure 4A:
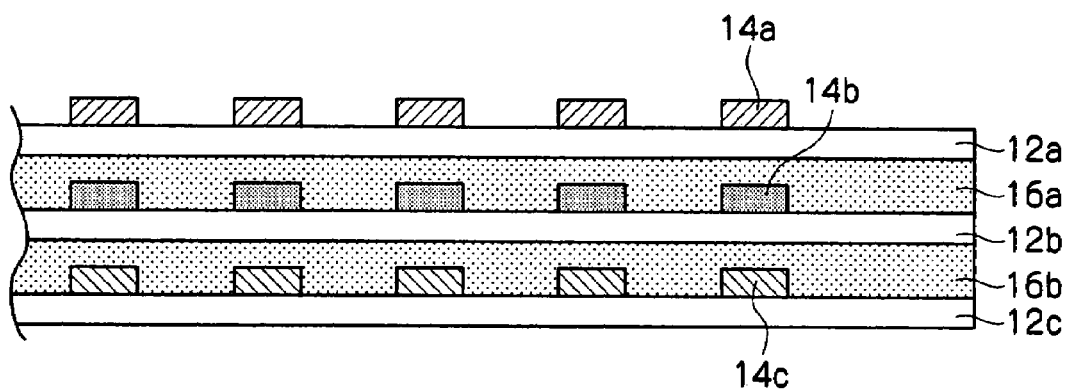
FIG. 4A is an end cross-section taken along B-B of FIG. 2.
Figure 4B:
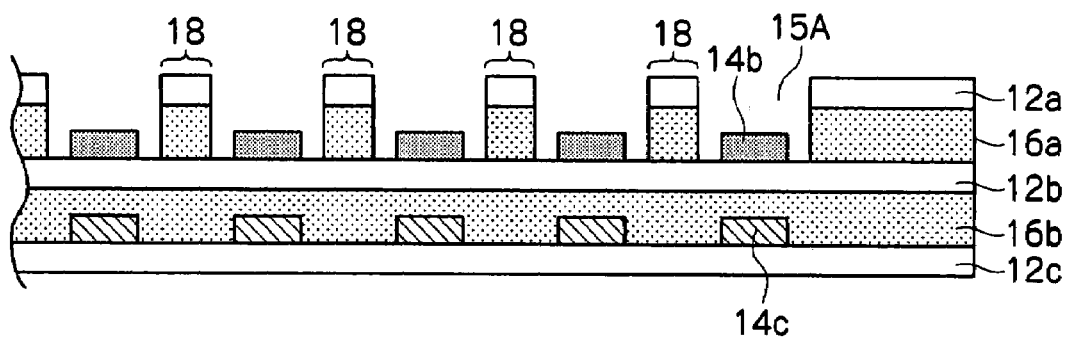
FIG. 4B is an end cross-section taken along C-C of FIG. 2.
Figure 4C:
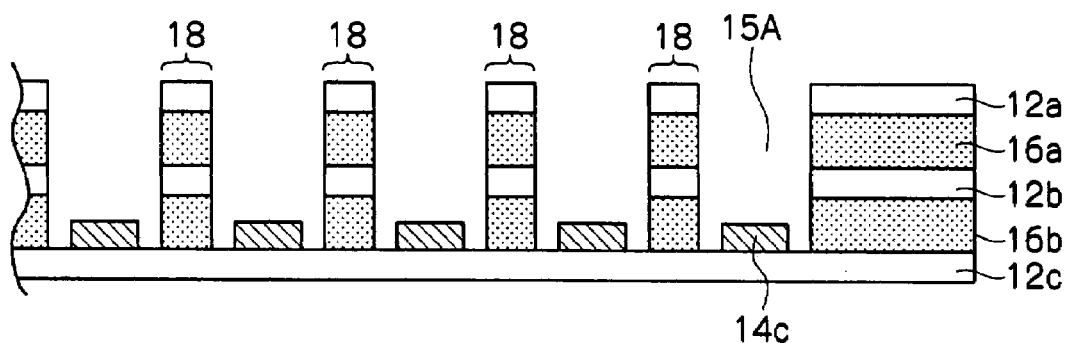
FIG. 4C is an end cross-section taken along D-D of FIG. 2.

FIG. 2, is a plan view of a partial enlargement of an end portion (external terminal connection portion) of the display medium 10. FIG. 3 is an end cross-section taken along A-A of FIG. 2; FIGS. 4A to 4C are end cross-sections taken, respectively, along B-B, C-C, and D-D of FIG. 2.

As shown in FIG. 1 to FIG. 4, in the display medium 10, the lead lines 14a, 14b and 14c respectively formed on the flexible substrates 12a, 12b and 12c are arranged so as to be superimposed on each other in the stacking direction of the display medium 10, and hole portions 15A are provided, of a depth corresponding to that at which each of the lead lines is formed, in the display element above the lead lines 14b and 14c that are located at positions at a lower portion of the layered structure, such that both the lead lines 14b and 14c are exposed. The lead lines 14a formed on the flexible substrate 12a, and the lead lines 14b and 14c exposed at the hole portions 15A are exposed in a step form when moving along the same straight line (in direction Y in FIG. 2).

Here, "at positions at a lower portion of the layered structure" means positions to the side of the flexible substrates relative to its respective stacked display elements.

In this manner, by exposing both of the lead lines 14b and 14c through the hole portions 15A, when electrically connecting the display elements 11a, 11b and 11c to a relay substrate for external connection and to external portions, a relay substrate for external connection for each of the display elements is not required, and a single relay substrate for external connection may be used.

At the hole portions 15A side of the display medium 10 there is a ridge portion 17 formed (see FIG. 3), and between the plural hole portions 15A that exist there are ridge portions 18 formed (see FIGS. 4B and 4C). Since the ridge portion 17 and the ridge portions 18 have the same thickness as that of the display medium 10, therefore the end portion (external terminal connection portion) of the display medium 10 is of excellent strength.

The display elements 11a, 11b and 11c configuring the display medium 10 are stacked with the adhesive layers 16a and 16b therebetween. The adhesive layers 16a and 16b are preferably formed to cover the whole of the surface between the display elements 11a and 11b, and 11b and 11c, but may be formed only on a partial region thereof.

The relay substrate for external connection connected to the display medium 10 is preferably a flexible substrate and, for example, a FPC (Flexible Printed Circuit) or the like, may be used.

The ridge portion 17 and the ridge portions 18, when the display elements and flexible substrate are connected through an ACF (Anisotropic Conductive Film) by thermo-compression bonding or the like, the ridge portion 17 and ridge portions 18 are buried within the flexible substrate, and so may also perform a so-called wedge function, fixing more firmly the connected display elements and the relay substrate for external connection.

Figure 5:
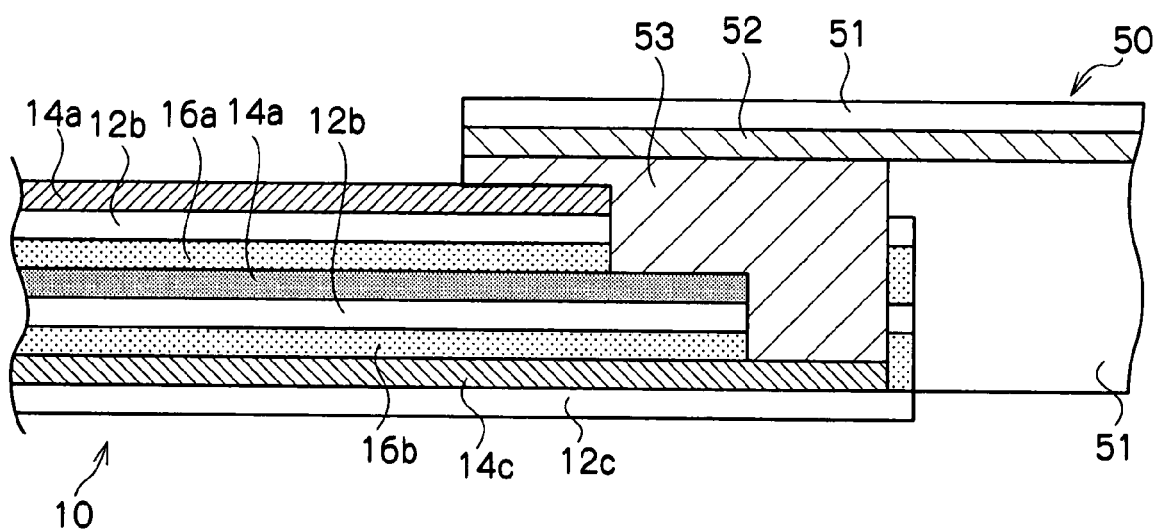
FIG. 5 is an outline diagram showing connections between a display medium according to the present invention and a flexible substrate.

FIG. 5 shows a cross-section of the state of an external connection relay substrate 50 connected to the external terminal connection portion of a display medium 10. The external connection relay substrate 50 is configured with a base 51 made from a flexible material, external connection relay lines 52 disposed on the base 51, and an ACF 53 that is disposed on the terminal portion of the external connection relay lines 52 so as to be connected thereto. An end portion of the external connection relay substrate 50 and the external terminal connection portion of the display medium 10 are connected together by thermo-compression bonding or the like, and the exposed portions of lead lines 14a, 14b and 14c of the display medium 10 are in contact with the ACF 53 of the external connection relay substrate 50, and the display medium 10 is electrically connected to external portions through the external connection relay substrate 50.

Explanation will now be given of the first to the fourth example modifications, which are example modifications of the exemplary embodiment A.

FIRST EXAMPLE MODIFICATION

Figure 6:
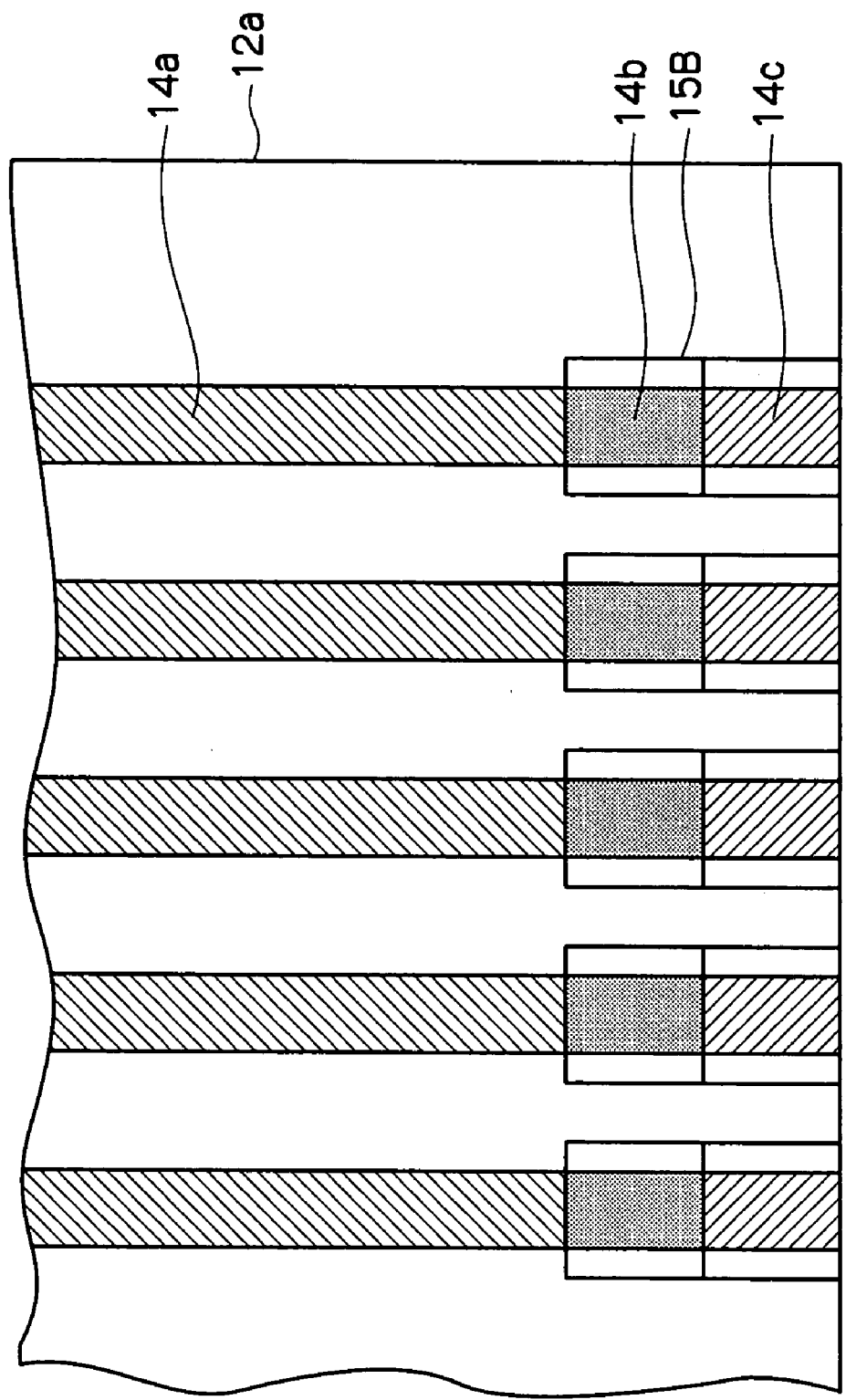
FIG. 6 is a plan view showing a partial enlargement of an end portion (external terminal connection portion) of a display medium according to a first example modification to the exemplary embodiment A of the present invention.

FIG. 6 is a plan view of a partial enlargement of an end portion (external terminal connection portion) of the display medium according to the first example modification. In the first example modification the configuration is basically the same as that of the display medium 10 of the exemplary embodiment A, but instead of the above described hole portions 15A, there are cut-away portions 15B.

Since elements of the configuration of the first example modification, other than the cut-away portions 15B, are similar to those of the exemplary embodiment A, the same reference numerals are used.

Figure 7:
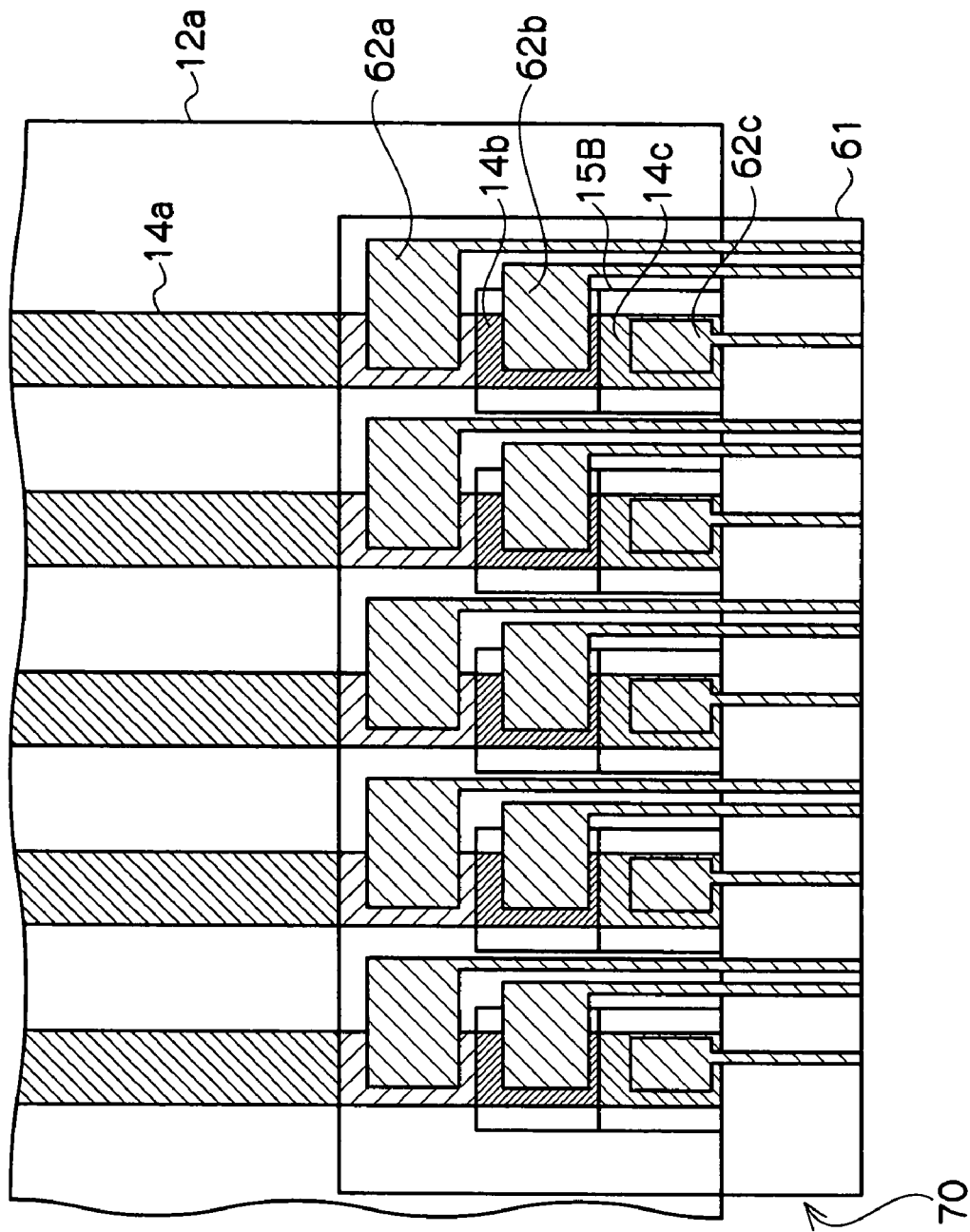
FIG. 7 is a top surface view showing an example of connections between a display medium according to the first example modification and an external connection substrate.

FIG. 7 is a top surface view showing an example of connections between a display medium according to the first example modification and an external connection substrate 60, and shows in the first example modification a connection state in which the lead lines 14a, 14b and 14c that are exposed to the outside are connected, respectively, to external connection relay lines 62a, 62b, and 62c that are disposed on a single base 61 configuring a substrate for external connection.

SECOND EXAMPLE MODIFICATION

Figure 8:
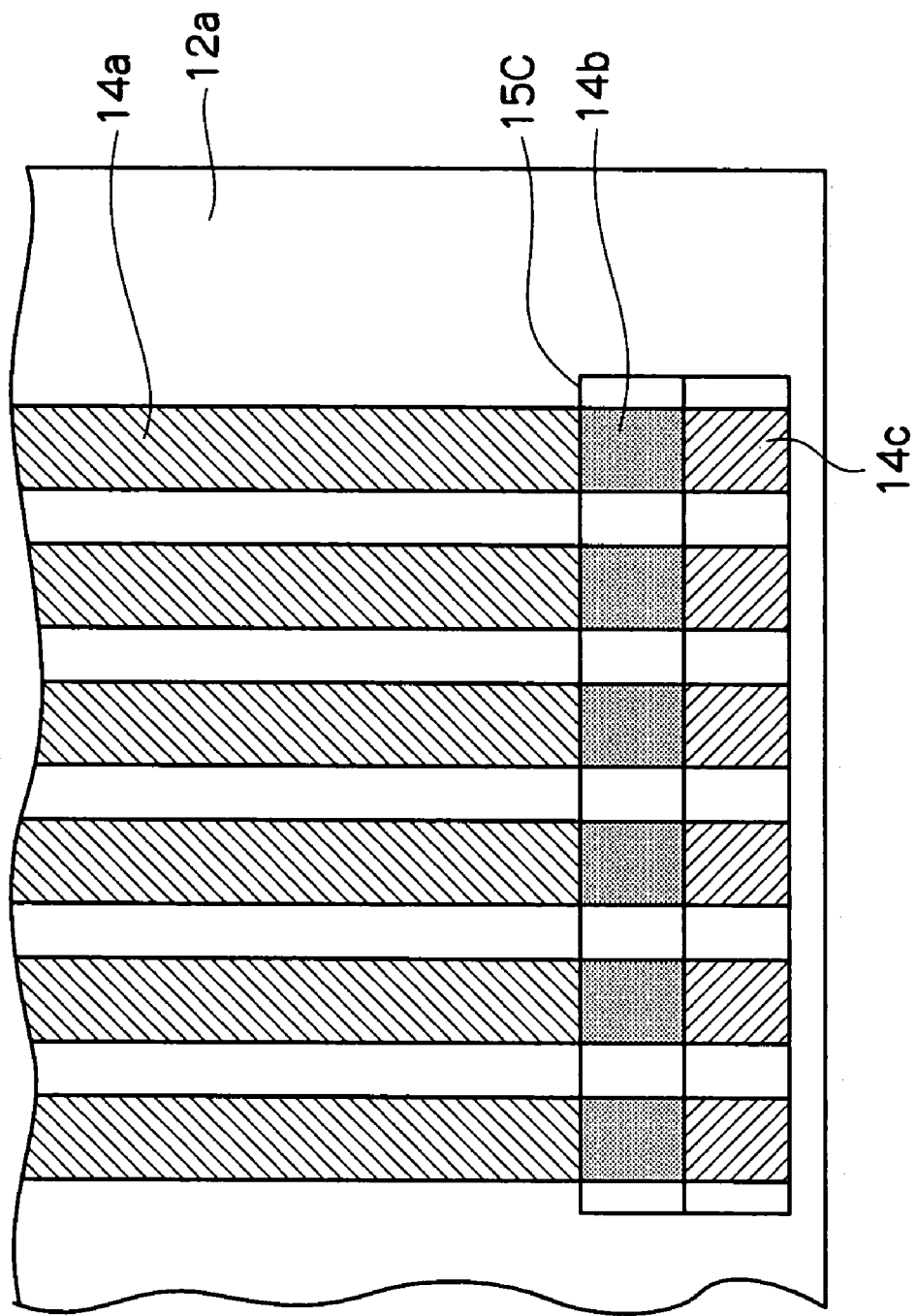
FIG. 8 is a plan view showing a partial enlargement of an end portion (external terminal connection portion) of a display medium according to a second example modification.

FIG. 8 is a plan view showing a partial enlargement of an end portion (external terminal connection portion) of a display medium according to a second example modification. In the second example modification the configuration is basically the same as that of the display medium 10 of the exemplary embodiment A, but instead of the above described hole portions 15A, there is/are hole portion(s) 15C. The hole portions 15C are a form in which plural hole portions 15A have been made common, and plural lead lines that are arranged parallel to each other in a direction that is orthogonal to the stacking direction of the display elements (a group of lead lines 14a, 14b or 14c for example) are exposed through a single hole portion 15C.

Since elements of the configuration of the second example modification, other than the hole portions 15C, are similar to those of the exemplary embodiment A, the same reference numerals are used.

THIRD EXAMPLE MODIFICATION

Figure 10A:
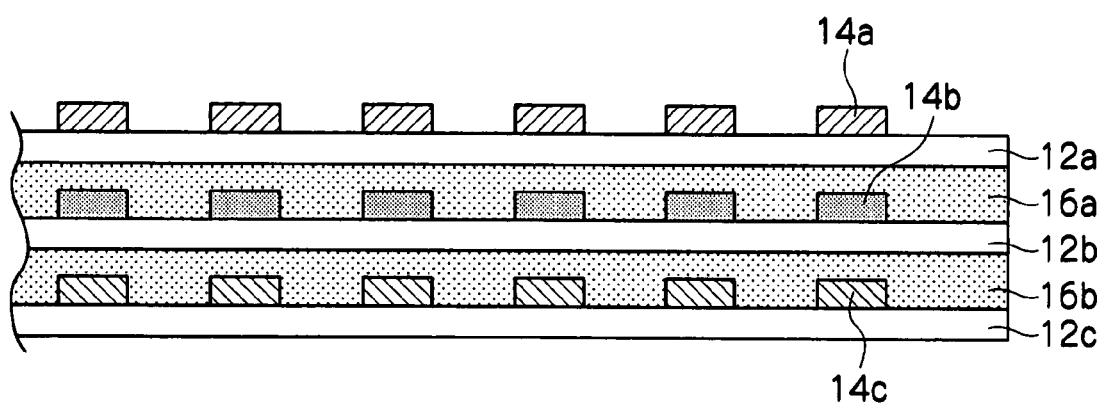
FIG. 10A is an end cross-section taken along E-E of FIG. 9.
Figure 10B:
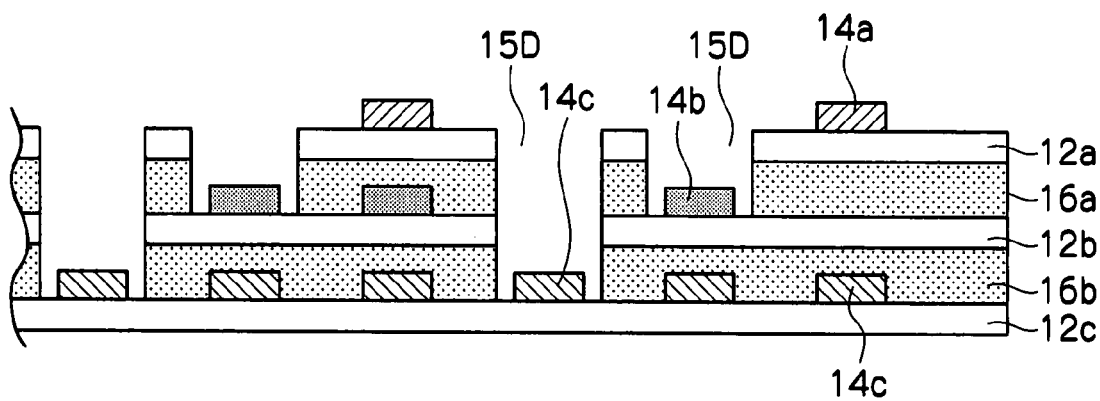
FIG. 10B is an end cross-section taken along F-F of FIG. 9.

FIG. 9 is a plan view showing a partial enlargement of an end portion (external terminal connection portion) of a display medium according to a third example modification. FIG. 10A and FIG. 10B are end cross-sections taken respectively along E-E and F-F of FIG. 9.

In the third example modification the configuration is basically the same as that of the display medium 10 of the exemplary embodiment A, but hole portions 15D arranged along a direction X and stepped in a direction Y, wherein the direction X is a direction that is along one of the edges of the display medium, and the direction Y is a direction that is along an edge of the display medium that is orthogonal to the direction X.

Since elements of the configuration of the third example modification, other than the hole portions 15D, are similar to those of the exemplary embodiment A, the same reference numerals are used.

By arranging the hole portions 15D stepped in this manner, the strength of the external terminal connection portions of the display medium may be further increased.

The present example modification, as shown in FIG. 9 and FIG. 10, has exposed through a single hole portion one or other of the lead lines 14b or the lead lines 14c, however both the lead lines 14b and 14c may be exposed through the same hole portion 15D, similar to in the exemplary embodiment A.

FOURTH EXAMPLE MODIFICATION

Figure 11:
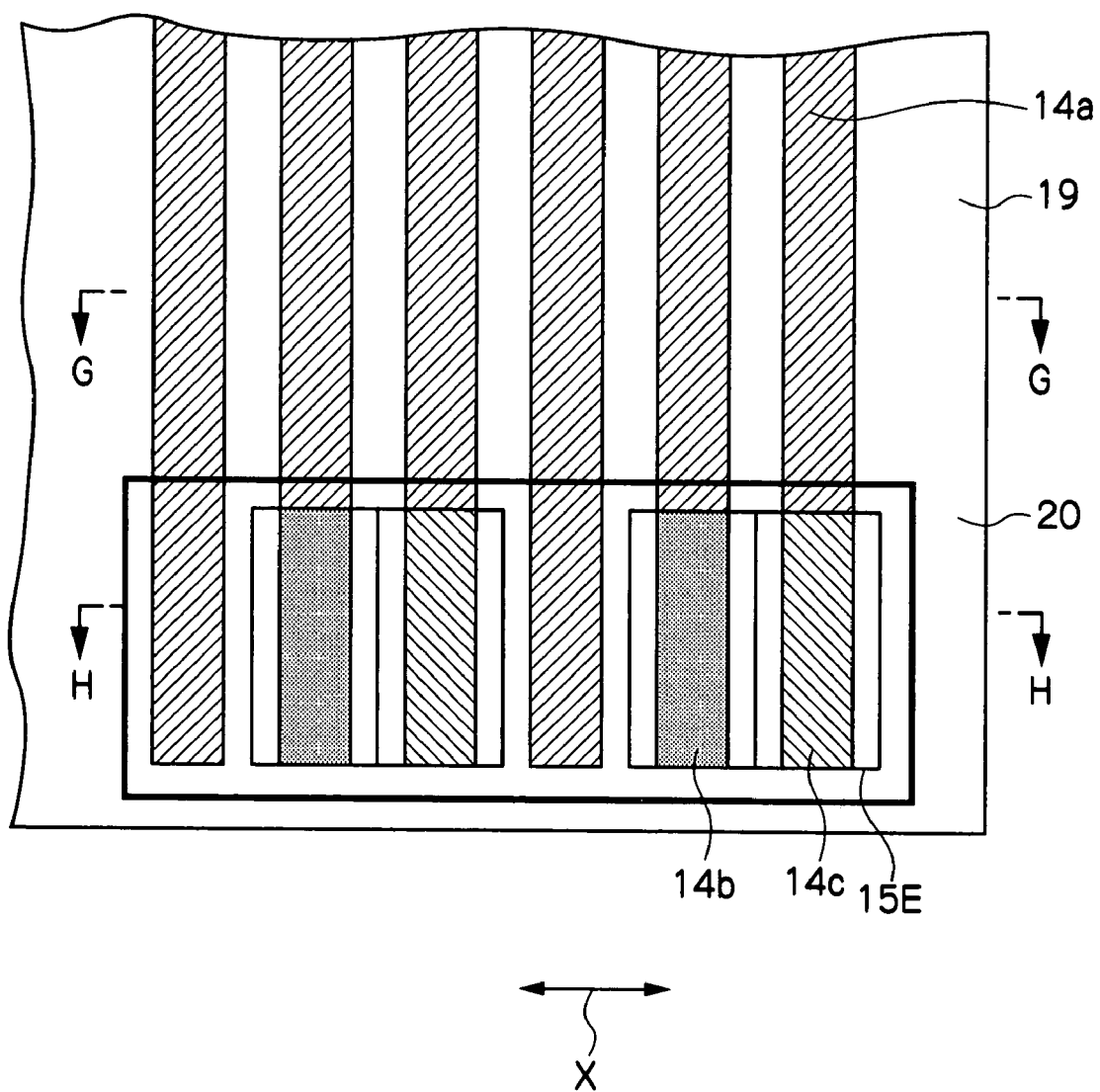
FIG. 11 is a plan view showing a partial enlargement of an end portion (external terminal connection portion) of a display medium according to a fourth example modification.

FIG. 11 is a plan view showing a partial enlargement of an end portion (external terminal connection portion) of a display medium according to a fourth example modification.

Figure 12:
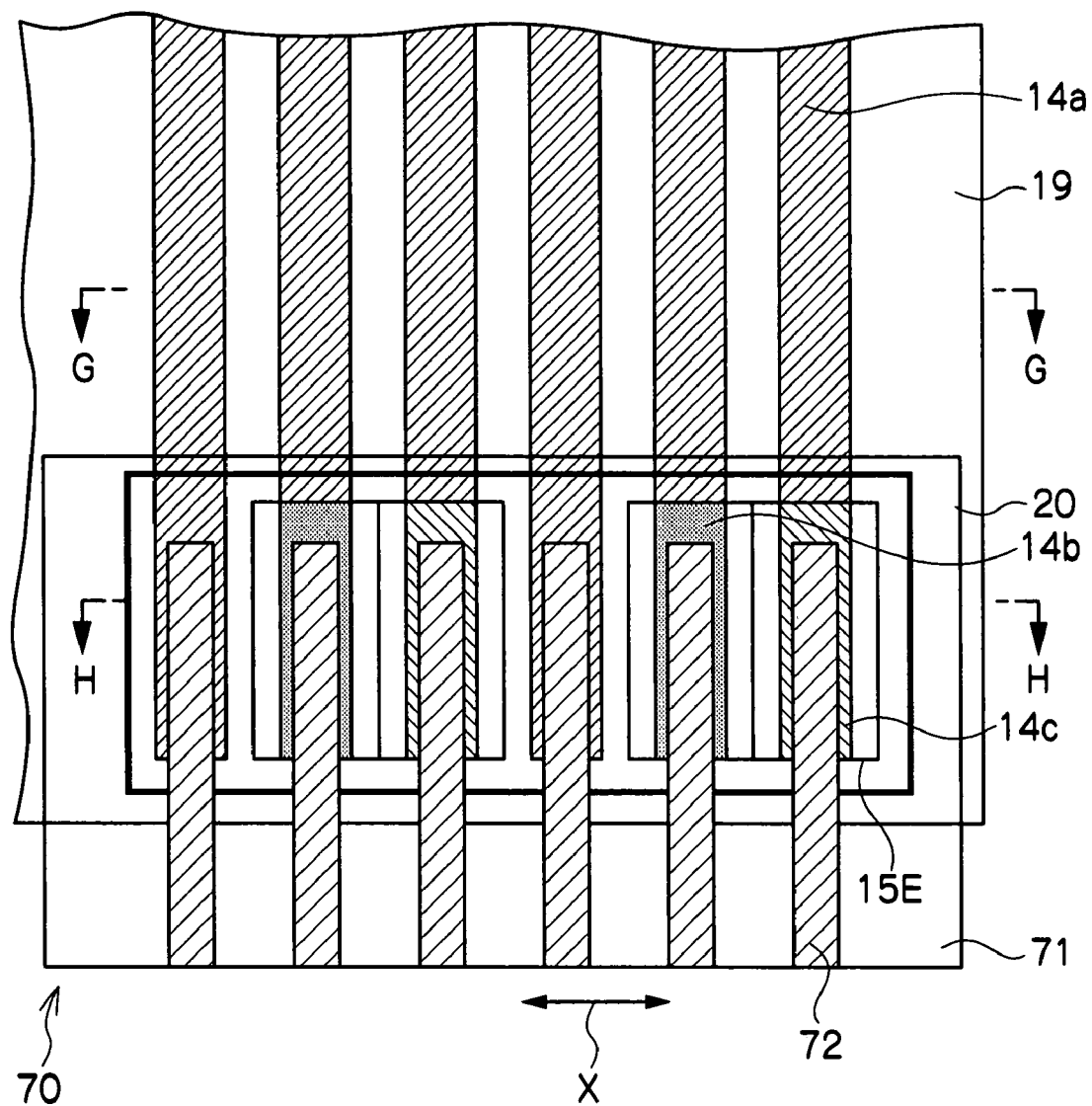
FIG. 12 is a top surface view showing an example of connections between a display medium according to the fourth example modification and an external connection substrate.

FIG. 12 is a top surface view showing an example of connections between a display medium according to the fourth example modification and an external connection substrate 70, showing a connection state in which the lead lines 14a, 14b and 14c that are exposed to the outside in the fourth example modification are respectively connected to plural external connection relay lines 72 that are disposed on a single base 71 configuring a substrate for external connection.

Figure 13A:
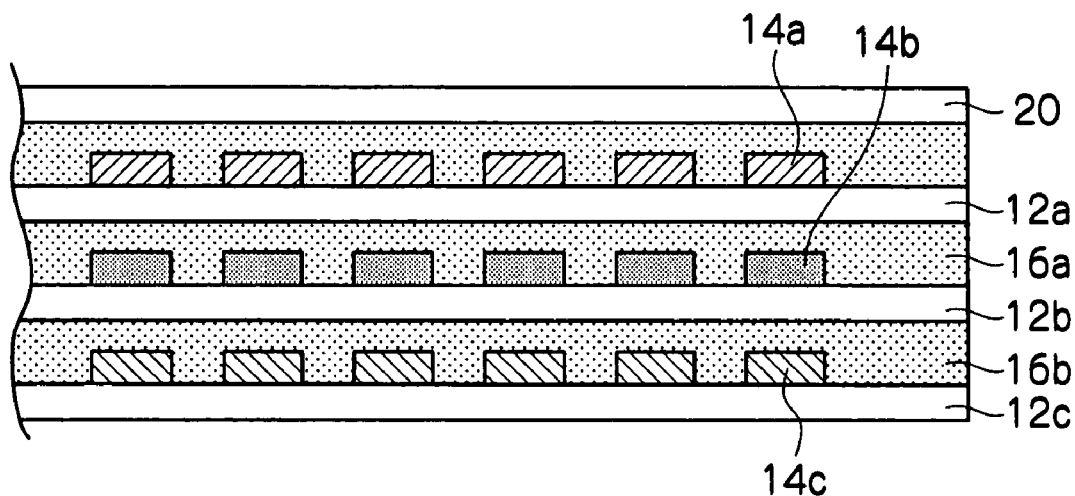
FIG. 13A is an end cross-section taken along G-G of FIG. 11.
Figure 13B:
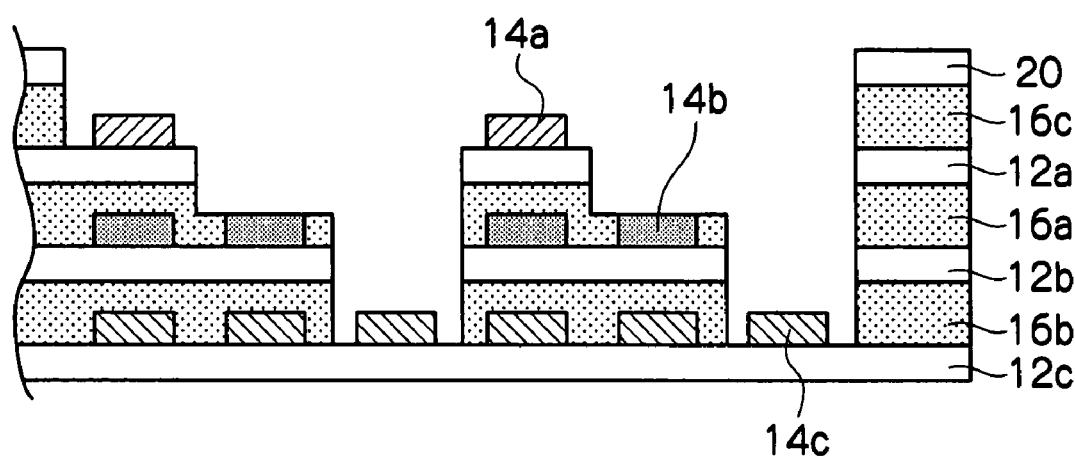
FIG. 13B is an end cross-section taken along H-H of FIG. 11.

FIG. 13A and FIG. 13B are end cross-sections taken respectively along G-G and H-H of FIG. 11.

In the fourth example modification the configuration is basically the same as that of the display medium 10 of the exemplary embodiment A, but lead lines 14a and 14b are arranged rowed in a direction (direction X) that is along one of the edges of the display medium and arranged in parallel to each other in a direction that is orthogonal to the stacking direction of the display elements, and are exposed through a single hole portion 15E.

The fourth example modification has a protective layer 20, provided on the display elements at a location at an upper portion of the layered structure, with hole portions or cut-away portions therein so as to expose the lead lines 14a, 14b and 14c.

It is preferable that a protective layer is also provided to the above exemplary embodiment A and the first to the fourth example modifications.

Since elements of the configuration of the fourth example modification, other than the hole portion 15E and the protective layer 20, are similar to those of the exemplary embodiment A, the same reference numerals are used.

Further explanation will now be given of common elements of the display medium of the present invention explained in the exemplary embodiment A and the first to the fourth example modifications thereof.

Flexible Substrate

A base plate of a polymer film or the like may be used as the flexible substrate of the display medium. Examples that may be given thereof include, for example, PEN, PC, PET and the like.

Particulars Relating to the Pixel Portions and the Lead Lines

The pixel portion of the display medium of the present invention include at least one pixel, and there are lead lines leading from the electrodes of the pixel(s). The pixels of each of the display elements may be superimposed in the stacking direction of the display medium, or may be arranged so as to be parallel to each other in a direction that is orthogonal to the stacking direction of each of the display elements.

Figure 14:
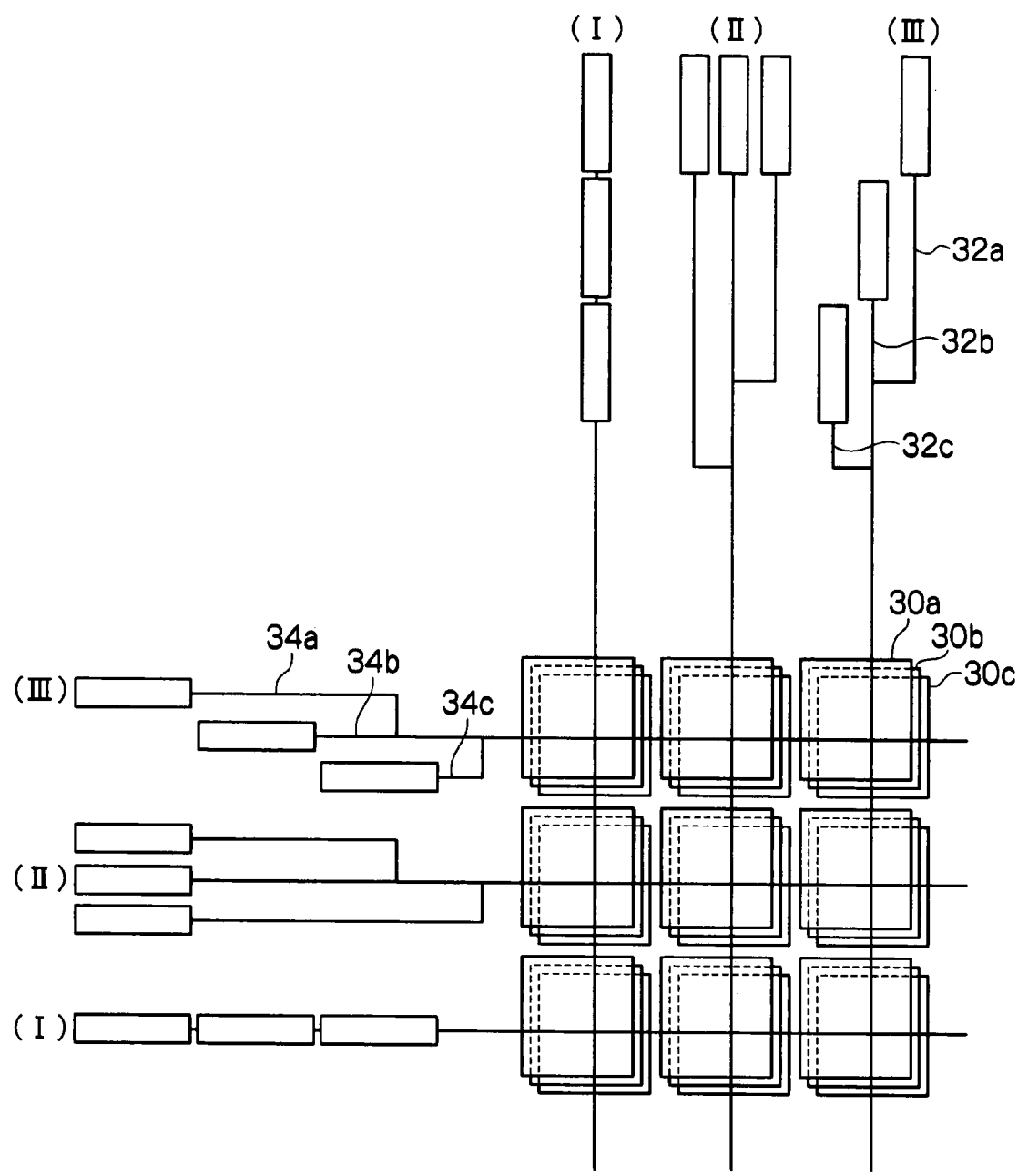
FIG. 14 is a plan view showing schematically an example pixel arrangement in a pixel portion, and an example arrangement of lead lines that leading from each of the pixels.
Figure 15:
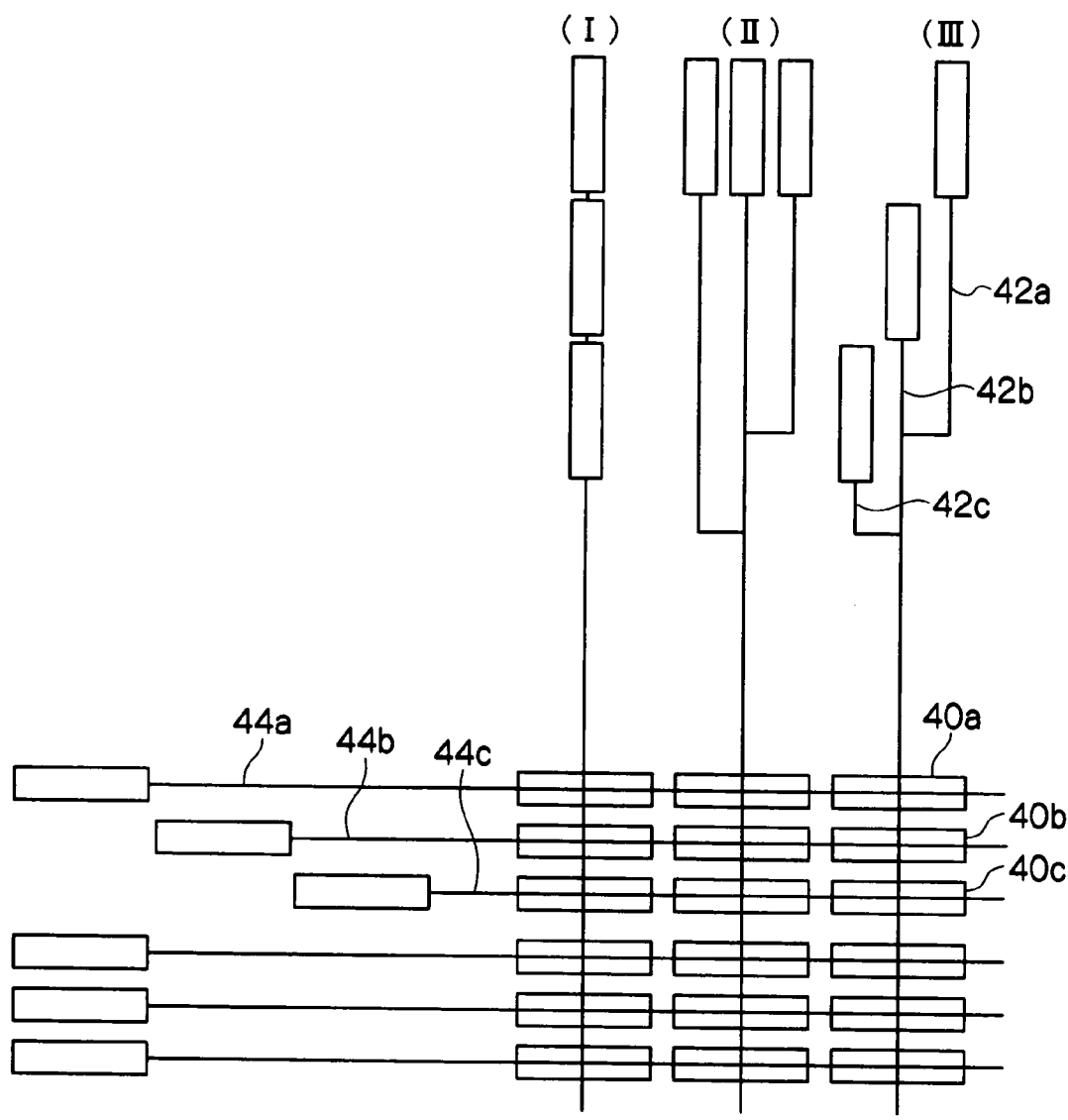
FIG. 15 is a plan view showing schematically an example pixel arrangement in a pixel portion, and an example arrangement of lead lines that leading from each of the pixels.
Figure 16:
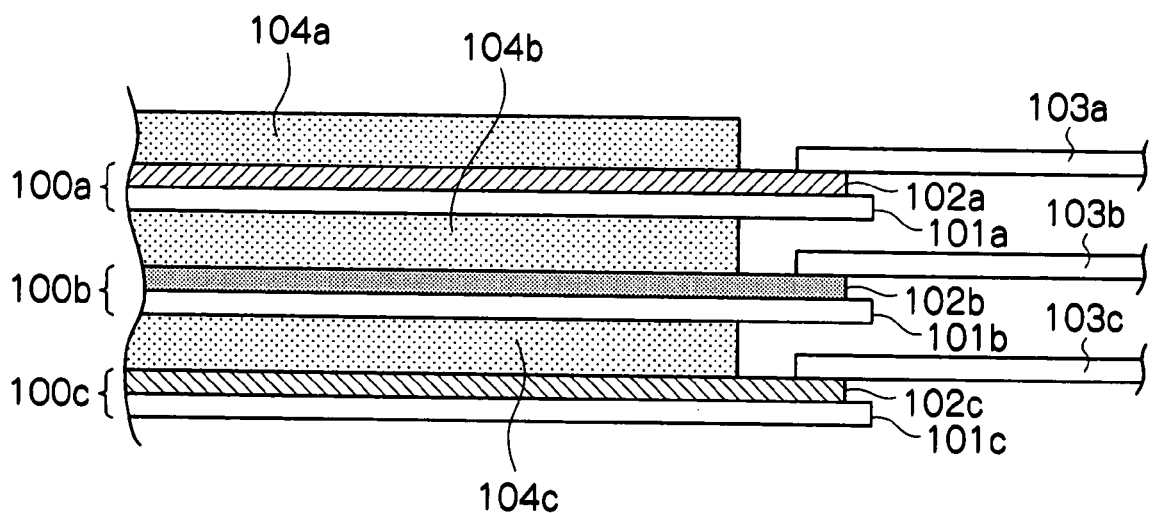
FIG. 16 is a partial cross-section showing a conventional example of a display medium.

FIG. 14 and FIG. 15 are plan views showing schematically examples of pixel arrangements in the pixel portion, and example arrangements of lead lines leading from each of the pixels.

FIG. 14 shows a pattern in which pixels 30a, 30b and 30c on the display elements are superimposed in the stacking direction, shows lead lines 32a, 32b and 32c leading out in the column direction, and shows lead lines 34a, 34b and 34c leading out in the row direction. The pixels 30a, 30b and 30c are each formed on different flexible substrates.

FIG. 15 shows a pattern in which pixels on the each of the display elements (40a, 40b and 40c) are arranged so as to be parallel to each other in a direction that is orthogonal to the stacking direction, shows lead lines 42a, 42b and 42c leading out in the column direction, and shows lead lines 44a, 44b and 44c leading out in the row direction. The pixels 40a, 40b and 40c are each formed on different flexible substrates.

As shown in FIGS. 14 and 15, the arrangement patterns of each of the lead line end portions may take up: a pattern in which they are superimposed vertically in the stacking direction of the display medium (portions shown by (I) in FIGS. 14 and 15); a pattern in which they are rowed in a single row parallel to each other along a direction that is orthogonal to the stacking direction of the display medium (portions shown by (II) in FIGS. 14 and 15); or a pattern in which they are rowed in a step-like pattern along a direction that is parallel to the stacking direction of the display medium (portions shown by (III) in FIGS. 14 and 15). The above exemplary embodiment A and the first to the fourth example modifications thereof may take any of the above patterns (I) to (III).

Any one of the above patterns (I) to (III), or combinations thereof, may be applied to the arrangement pattern of the lead line end portions in the display medium of the present invention.

In the present invention, by configuring each of the display elements with respectively different colors for the pixel portion of each of the display elements configuring the layered structure, the display medium of the present invention may be made multi-color display compatible.

Pixels displaying organic electroluminescence or inorganic electroluminescence may be used for the pixel portion.

There are no particular limitations to the pixels displaying organic electroluminescence for the pixel portion, and they may be formed according to the application. For example, when forming pixels displaying organic electroluminescence using low molecular weight based materials, a transparent anode first electrode of ITO or the like may be formed on a flexible substrate, then after cleaning, an organic layer such as a light-emitting layer may be formed as a film by vacuum deposition. Next, a second electrode of ITO or the like may be formed by sputtering. When forming pixels of an organic EL element using high molecular weight based materials, after forming an organic layer, this time using a coating method, a printing method, a spin coating method, an inkjet method or the like, a second electrode of ITO or the like may be formed by sputtering. A layered multi photon emission element may be formed with a series of light emitting layers or the like.

Adhesive Layer

The adhesive layer may be made, for example, using double-sided tape or thermosetting resin or the like.

Protective Layer

A protective layer that is applicable to the present invention is one which is formed on or above a display element located at an upper portion of the layered structure, and has hole portions or cut-away portions therein so as to expose the lead lines. PEN, PC, PET and the like may, for example, be used for the protective layer. The hole portions or cut-away portions of the protective layer may be provided by punching out using a mold.

Production Method of the Display Medium

The display medium of the present invention may be manufactured, for example, in the following manner.

A transparent conducting film of an ITO layer of 100 nm thickness is formed as a film on PEN that is to form the flexible substrate. Next, a striped pattern is formed thereon of photoresist using a photolithographic method, and a striped first electrode obtained through etching and peeling processes.

Next plural organic layers are formed in sequence through a predetermined vapor deposition mask by a vacuum deposition method, forming an EL layer. Here, "plural organic layers" indicates hole injection layer(s), hole transport layer(s), light emitting layer(s), electron transport layer(s), electron injection layer(s) and the like, and each of the respective layers is selected of a suitable organic material to correspond with the particular desired light emitting color, such as red, green, or blue.

Next, as a second electrode, an Al film, an Ag film, and an ITO film are formed with respective thicknesses of 1.5 nm, 15 nm and 100 nm by vacuum deposition, sputtering, using a striped film forming mask so that the second electrode is orthogonal to the first electrode. By doing so the intersecting portions of the first electrode and the second electrode may emit light, and plural pixel portions are provided.

Next, a sealing film is formed so as to cover the light emitting elements. The sealing film may be formed by a CVD method, for example so as to form a film of SiON of 5 μm.

Three display element sheets of red, green and blue may be produced in the above manner. Then, in order to adhere together the three display element sheets and the protective layer film in the sequence red, green, blue, protective layer film, a adhesive layer (Trade name: HJ-9150W; manufactured by Nitto Denko Corporation) is stuck to the reverse face of each of the green, blue and protective layer films, so as to cover the entire surfaces thereof.

Next, hole portions are provided in predetermined positions in each of the adhesive layers using a hole forming mold, such that the positions of the red, green and blue lead lines are exposed to the top of the protective layer, the positions of the green and

[red]

lead lines are exposed to the top of the blue display element, and the positions of the

[red]

lead lines are exposed to the top of the green display element.

Next each of the red, green and blue display elements are aligned and stuck together so as to be superimposed on each other, and the display medium is completed.

In response to the problem when lead lines are provided in a step form of lead lines severing due to concentration of load on the weakest portions, the display medium of the present invention has hole portions or cut-away portions only at the lead line portions, and so there is no concentration of stress at a single point when the display medium is bent, and severing of the lead lines may be prevented.

The display medium produced in the above manner is stacked in the sequence red, green, blue, however, the stacking sequence may be changes as desired to green, blue and red. Furthermore, the since the first electrode and the second electrode are formed from ITO, which is a transparent conducting film, light emission from both sides is possible, however, the first electrode of the display element that becomes the bottommost layer, or the second electrode of the display element that becomes the uppermost layer, may be formed using a non-transparent material such as Al, and due to the high reflectivity thereof, a single side light emitting display medium may be made.

As described above, according to the present invention, the strength of the external terminal connection portion is high, and, even if there are two or more stacked display elements, a display medium may be provided that is easy to electrically connect to a relay substrate for external connection.

The display medium of the present invention is suitably applied to improving the strength of lead line portions when different display elements are stacked together.

All publications, patent applications, and technical standards mentioned in this specification are herein incorporated by reference to the same extent as if each individual publication, patent application, or technical standard was specifically and individually indicated to be incorporated by reference.

What is claimed is:

1. A display medium comprising:
   a layered structure that comprises two or more stacked display elements that each are provided, on or above a flexible substrate, with a pixel portion and lead line(s) for electrically connecting the pixel portion to outside of the pixel portion; and
   a hole portion or a cut-away portion included in the display element(s) that are above one or more of the lead line(s) of the display element(s) at a lower portion of the layered structure, so that the one or more of the lead line(s) of the lower portion display element(s) are exposed, wherein each of the stacked display elements comprises electrodes that are electrically independent from each other stacked display element.

2. The display medium according to claim 1, wherein there are two or more of the hole portions or of the cut-away portions, and the two or more of the hole portions or of the cut-away portions are arranged in a row along a direction X, wherein the direction X is a direction that is along one of the edges of the display medium.

3. The display medium according to claim 1, wherein there are two or more of the hole portions or of the cut-away portions, and the two or more of the hole portions or of the cut-away portions are arranged along a direction X and stepped in a direction Y, wherein the direction X is a direction that is along one of the edges of the display medium, and the direction Y is a direction that is along an edge of the display medium that is orthogonal to the direction X.

4. The display medium according to claim 1, wherein the respective lead lines of each of the two or more stacked display elements are arranged so that they are superimposed in the display element stacking direction.

5. The display medium according to claim 1, wherein the respective lead lines of each of the two or more stacked display elements are arranged so that they are parallel to each other in a direction that is orthogonal to the display element stacking direction.

6. The display medium according to claim 1, wherein two or more of the lead lines are exposed through a single hole portion or cut-away portion.

7. The display medium according to claim 1, further comprising a protective layer provided on or above the display element located at an upper portion of the layered structure, the protective layer including a hole portion or a cut-away portion provided such that one or more of the lead lines are exposed.

8. The display medium according to claim 1, wherein the stacked display elements include two or more display elements that are different colors from each other.

9. The display medium according to claim 1, wherein the pixel portion include pixel portion that use organic electroluminescence.

10. The display medium according to claim 1, wherein the two or more display elements are stacked with a adhesive layer therebetween that is formed to cover the whole of the surface between the display elements.

* * * * *